United States Patent [19]

Iwasaki et al.

[11] Patent Number: 4,557,997

[45] Date of Patent: Dec. 10, 1985

[54] PHOTO-POLYMERIZABLE PROCESS OF IMAGE FORMATION USING UNSATURATED MATERIALS AND SILVER HALIDE

[75] Inventors: Masayuki Iwasaki; Akira Umehara, both of Kanagawa, Japan

[73] Assignee: Fuji Photo Film Co., Ltd., Kanagawa, Japan

[21] Appl. No.: 614,384

[22] Filed: May 25, 1984

Related U.S. Application Data

[63] Continuation of Ser. No. 391,330, Jun. 23, 1982, abandoned.

[30] Foreign Application Priority Data

Jun. 23, 1981 [JP] Japan ............................... 56-97258

[51] Int. Cl.$^4$ ............................................... G03C 5/00
[52] U.S. Cl. ..................................... 430/325; 430/281; 430/300; 430/306; 430/322; 430/906; 430/910
[58] Field of Search ............... 430/281, 300, 306, 322, 430/325, 906, 910

[56] References Cited

U.S. PATENT DOCUMENTS 3,019,104 1/1962 Oster ................................... 430/264
3,625,696 12/1971 Krauch et al. ..................... 430/906
4,170,481 10/1979 Akama et al. ..................... 430/906
4,243,743 1/1981 Hiramoto et al. ................. 430/906

FOREIGN PATENT DOCUMENTS 866631 4/1961 United Kingdom .
1269711 4/1972 United Kingdom .

OTHER PUBLICATIONS

Levinos, S., Photographic Science and Engineering, vol. 6, No. 4, Aug. 1962, pp. 222–226.

*Primary Examiner*—Jack P. Brammer
*Attorney, Agent, or Firm*—Sughrue, Mion, Zinn, Macpeak & Seas

[57] ABSTRACT

A photo-polymerizable dispersion composition is disclosed. The dispersion composition includes a silver halide which is dispersed within a polyfunctional vinyl monomer and a high molecular binder. The binder is obtained by vinyl polymerization and contains a water insoluble polymer having amide groups and carboxyl group. The resulting dispersion composition can be utilized to form high polymer images having a good oleophilic property which exhibit less swelling even if developed in an aqueous developing solution.

5 Claims, No Drawings

PHOTO-POLYMERIZABLE PROCESS OF IMAGE FORMATION USING UNSATURATED MATERIALS AND SILVER HALIDE

This application is a continuation of application Ser. No. 391,330 filed June 23, 1982 now abandoned.

FIELD OF THE INVENTION

The present invention relates to photopolymerizable compositions containing silver halide as a photo-initiator. Particularly, the present invention relates to photo-polymerizable compositions where photosensitive silver halide insoluble in water and organic solvents are uniformly dispersed in an organic high polymer insoluble in water but soluble in organic solvents, as a binder.

BACKGROUND OF THE INVENTION

Photo-polymerizable compositions (as described, for example, in U.S. Pat. Nos. 3,046,127 and 3,549,367) are essentially composed of a photo-initiator, a polymerizable compound and a binder, which become insoluble in solvents by polymerization of the exposed part when exposed to light. This property has been broadly utilized in areas such as sensitive layers of photoresist, lithographic printing plates and various other image recording materials, UV hardenable inks and coatings. For example, U.S. Pat. Nos. 2,760,863 and 2,791,504 disclose use for preparing relief printing plates; U.S. Pat. Nos. 3,060,023, 3,060,024 and 3,060,025 disclose use for producing copies of images; U.S. Pat. Nos. 3,479,185 discloses use for producing a lithographic printing plate; and U.S. Pat. Nos. 3,469,982 and 3,526,504 disclose use for producing photoresists. However, in most photo-polymerizable compositions, organic compounds such as Michler's ketone are used as a photo-initiator. Accordingly, the light sensitivity thereof is at most $10^5$ to $10^6$ erg/cm$^2$ and sensitizable light wavelength is limited to a short wavelength range of less than 400 nm. Therefore, their use is limited, because they do not have a sufficient sensitivity to light of, for example, 488 nm and 514.5 nm in visible argon laser at an output of several mW.

On the other hand, silver halide has been broadly used as a photosensitive material of photographic films, because it has a high sensitivity to light. Further, it is known that silver halide containing image recording materials are capable of expanding their spectral sensitivities to a wide wavelength range from ultraviolet light to visible light by using sensitizing dyes such as cyanine dyes or merocyanine dyes. For this reason, it has been proposed to utilize a silver halide emulsion as a photo-initiator of the photo-polymerizable compositions as described in British Pat. No. 866,631.

The photo-polymerizable compositions disclosed in British Pat. No. 866,631 comprise a combination of a silver halide emulsion using a water soluble high polymer (such as gelatin, polyvinyl alcohol, carboxymethyl cellulose, methyl cellulose, starch, polyvinyl pyrrolidone, polyacrylamide or casein, etc.) as a high polymer for dispersion of silver halide, a vinyl monomer and water. Further, British Pat. No. 866,631 has disclosed the application of the compositions to image formation, such as production of relief or lithographic printing plates. These compositions have good sensitivity. However, they have various faults when they are utilized for production of lithographic printing plates or photoresists, because water soluble high polymers are used as a dispersion medium for silver halide. More specifically, when they are applied to a suitable base to form a sensitive layer, the layers becomes adhesive if the humidity is high. Further, when the sensitive material is processed with water or an aqueous developing solution to remove unexposed unpolymerized part after imagewise exposure to light, the images obtained easily swell and can be easily damaged. If the resulting polymer images are used as a lithographic printing plate, ink adhesion to the image parts is inferior and, consequently, distinct printed images cannot be obtained.

Further, when a silver halide emulsion prepared with a hydrophilic high polymer is blended with an oleophilic high polymer binder, distinct printed images can not be obtained or the printing durability deteriorates. This is because the high polymers have inferior compatibility with each other.

When an emulsion is produced with an oleophilic high polymer, undesirable coarse particles are formed or the stability of the emulsion is insufficient because of inferior dispersion.

British Pat. No. 866,631 describes a process for producing photo-polymerizable compositions in a water-in-oil state. In accordance with this process, a silver salt emulsion using gelatin is dispersed in a toluene solution of a monomer (for example, pentaerythritol tetraacrylate) and ethyl cellulose. (But, there is no description relating to examples of image formation using those compositions.) The patent recommends the use of lauryl sulfonate as a dispersing agent in order to carry out good dispersion. However, if a wetting agent such as lauryl sulfonate is added, the strength of images further deteriorates, because the polymer images are easily separated from the base during development.

SUMMARY OF THE INVENTION

Accordingly, an object of the present invention is to provide high polymers for dispersion of silver halide and binders which do not have the above-described faults.

Another object of the present invention is to provide high polymers for dispersion in which silver halide can be well dispersed without using a wetting agent.

Another object of the present invention is to provide silver halide containing photo-polymerizable compositions having improved image strength, wherein the finally resulting high polymer images have a good oleophilic property and cause less swelling even if developed with an aqueous developing solution.

A further object of the present invention is to provide photo-polymerizable compositions having a high light sensitivity which can be used practically in visible light ranges.

Other objects of the present invention will become apparent to those skilled in the art from the following description.

These objects of the present invention can be attained by providing photo-polymerizable compositions comprising silver halide, a high molecular binder and a polyfunctional vinyl monomer, wherein said high molecular binder is obtained by vinyl polymerization and contains a water insoluble polymer having amide groups and carboxyl groups.

DETAILED DESCRIPTION OF THE INVENTION

Silver halide used in the present invention is photosensitive silver halide which is insoluble in water and organic solvents. Examples of such silver halide include silver chloride, silver bromide, silver iodide, silver chlorobromide, silver iodobromide and silver chlorobromoiodide, preferably silver chloride and silver bromide. They can be obtained by reacting silver nitrate with alkali metal halide or ammonium halide.

The high molecular binder used in the present invention is characterized by its ability to uniformly disperse silver halide in a non-aqueous medium and further characterized by an oleophilic property of hardened parts obtained by applying it to a base and subjecting it to imagewise exposure and development processing. Further, it has good compatibility with water soluble high molecular binders (such as, gelatin). Therefore, even if a water soluble high melecular binder (such as, gelatin) is used in case of preparing a silver halide dispersion, the resulting silver halide dispersion can be stably dispersed in the high molecular binder of the present invention.

The high molecular binder used in the present invention can be any polymer produced by vinyl polymerization which has amide groups and carboxyl groups. Particularly, copolymers of the following vinyl monomers of Group 1 and Group 2 are preferred, which may be copolymerized with vinyl monomers of Group 3 and/or Group 4.

Group 1 Amide group containing vinyl monomers.
Group 2 Carboxyl group or carboxylate group containing vinyl monomers.
Group 3 Alkyl, aralkyl or aryl esters of acrylic acid or methacrylic acid, styrene or vinyl alcohol esters.
Group 4 Weakly alkaline group containing vinyl monomers.

Preferred examples of amide group containing vinyl monomers of Group 1 include acrylamide, N-methyl acrylamide, N-ethyl acrylamide, N-n-propyl acrylamide, N-isopropylacrylamide, N-n-butylacrylamide, N-t-butylacrylamide, N-sec-butylacrylamide, N-n-pentylacrylamide, N-n-hexylacrylamide, N-cyclohexylacrylamide, N-n-heptylacrylamide, N-t-octylacrylamide, N-benzylacrylamide, N-phenylacrylamide, N,N-dimethylacrylamide, N,N-diethylacrylamide, methacrylamide, N-n-propylmethacrylamide, N-t-butylmethacrylamide, acryloylmorphorine and diacetoneacrylamide.

Preferred examples of carboxyl group or carboxylate group containing vinyl monomers of the Group 2 include acrylic acid, methacrylic acid, itaconic acid, maleic acid, fumaric acid and 4-vinylbenzoic acid, and metal salts, ammonium salts and phosphonium salts of them.

Preferred examples of alkyl, aralkyl or aryl esters of acrylic acid or methacrylic acid, styrene or vinyl alcohol esters of the Group 3 include methyl acrylate, ethyl acrylate, n-propyl acrylate, isopropyl acrylate, n-butyl acrylate, t-butyl acrylate, n-hexyl acrylate, cyclohexyl acrylate, 2-ethylhexyl acrylate, methyl methacrylate, ethyl methacrylate, n-propyl methacrylate, isopropyl methacrylate, n-butyl methacrylate, t-butyl methacrylate, 2-ethylhexyl methacrylate, t-octyl methacrylate, benzyl methacrylate, styrene, vinyltoluene, vinyl acetate, vinyl propionate and vinyl benzoate.

Preferred examples of weakly alkaline group containing vinyl monomers of the Group 4 include β-dimethylaminoethyl methacrylate, β-diethylaminoethyl methacrylate, β-di-n-propylaminoethyl acrylate, γ-dimethylaminopropylmethacrylamide, γ-diethylaminopropylmethacrylamide, 4-dimethylaminophenyl methacrylate, 3-diethylaminophenylacrylamide, 4-vinylpyridine, 2-vinylpyridine, N-vinylimidazole, N-methyl-2-vinylimidazole, 2-methyl-1-vinylimidazole and 3,5-dimethyl-1-vinyl-1,2,4-triazole.

Particularly preferred high molecular binders used in the present invention are high molecular compounds having a molecular weight of about 5,000 to about 1,000,000 represented by the following formula (I).

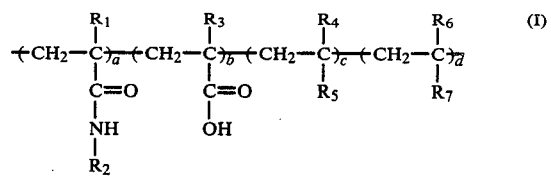

wherein $R_1$, $R_4$, $R_6$ and $R_{10}$: H or $CH_3$;

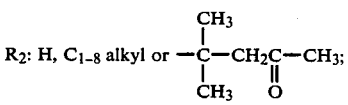

$R_3$: H, $CH_3$ or $CH_2COOH$;

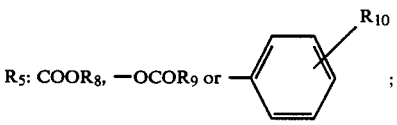

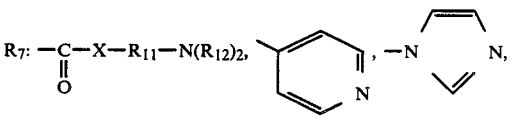

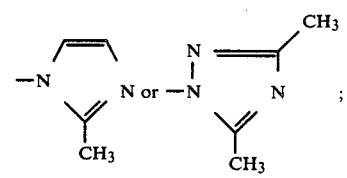

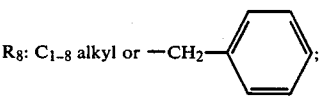

$R_9$: $C_{1-3}$ alkyl;

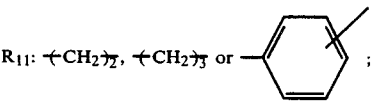

$R_{12}$: $C_{1-8}$ alkyl;
X: —O— or —NH—;
a: 99–10% by mol (preferably 95–20% by mol);
b: 1–20% by mol (preferably 3–15% by mol);
c: 0–80% by mol (preferably 0–65% by mol); and
d: 0–10% by mol (preferably 0–5% by mol).

The high molecular binder of the present invention can be synthesized by radical polymerization by a solution polymerization process, an emulsion polymerization process or a bulk polymerization process. However, the solution polymerization process is particularly prefered. Copolymers obtained by this process have a limiting viscosity of about 0.05 to about 2, and the number average molecular weight according to gel permeation chromatography is about 5,000 to about 1,000,000. Both the limiting viscosity and the number average molecular weight of them are suitable for the purpose of the present invention.

Suitable solvents used in the polymerization process for the high molecular binder of the present invention include alcohols, such as, methanol, ethanol, n-propanol, iso-propanol, n-butanol, iso-butanol, t-butanol, methoxyethanol (i.e., methyl cellosolve), ethoxyethanol, n-butoxyethanol, benzyl alcohol; ketones, such as, acetone, methyl ethyl ketone, methyl isobutyl ketone, diethyl ketone, cyclohexanone; cyclic ethers, such as, tetrahydrofuran, dioxane; esters, such as, methyl acetate, ethyl acetate, butyl acetate; halogenated hydrocarbons, such as, methylene chloride, chloroform, methylchloroform, ethylene chloride, trichloroethylene; amides, such as, dimethylformamide, dimethylacetamide; sulfoxides, such as, dimethyl sulfoxide; and aromatic hydrocarbons, such as, benzene, toluene, xylene, and, preferably, methanol, ethanol, iso-propanol, acetone and methyl ethyl ketone.

The polyfunctional vinyl monomer used for the photo-polymerizable compositions of the present invention is selected from compounds having at least two carbon-carbon unsaturated bonds in a molecule thereof and being very compatible with the above-described high molecular binder, Examples of such compounds include compounds having at least two ethylenically unsaturated bonds, which have a chemical structure of momoner, prepolymer, namely, dimer, trimer or other oligomers or mixture thereof, or high molecular polymer. More concrete examples of them include esters of unsaturated carboxylic acids with aliphatic polyhydric alcohols and amines of unsaturated carboxylic acids with aliphatic or aromatic polyamide compounds.

Examples of esters of unsaturated carboxylic acids with aliphatic polyhydric alcohols include, as acrylic acid esters, ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate and polyester acrylate oligomers, etc., preferably pentaerythritol tetraacrylate and dipentaerythritol hexaacrylate. Examples of methacrylic acid esters include tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis[p-(3-methacryloxy-2-hydroxypropoxy)phenyl]dimethylmethane and bis[p-(acryloxyethoxy)phenyl]dimethylmethane, etc., preferably trimethylolpropane trimethacrylate. Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate, etc., preferably ethylene glycol diitaconate. Examples of crotonic acid esters include ethylene glycol dicrotonate, tetramethylene glycol dicrotonate, pentaerythritol dicrotonate and sorbitol tetracrotonate, etc., preferably sorbitol tetracrotonate. Examples of isocrotonic acid esters include ethylene glycol diisocrotonate, pentaerythritol diisocrotonate and sorbitol tetraisocrotonate, etc., preferably sorbitol tetraisocrotonate. Examples of maleic acid esters include ethylene glycol dimaleate, triethylene glycol dimaleate, pentaerythritol dimaleate and sorbitol tetramaleate, etc., preferably sorbitol tetramaleate. In addition, there are mixtures of the above-described esters.

Examples of amides of unsaturated carboxylic acids with aliphatic or aromatic polyamine compounds include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, xylylenebismethacrylamine, m-phenylenebisacrylamide, p-phenylenebisacrylamide, N,N'-diacryloylpiperazine and N,N'-dimethyl-N,N'-diacryloylethylenediamine, etc., preferably xylylenebisacrylamide.

Other examples include vinylurethane compounds having two or more polymerizable vinyl groups in the molecule which are prepared by adding a hydroxyl group containing vinyl monomer represented by the following formula (III) to a polyisocyanate compound having two or more isocyanate groups in the molecule described in Japanese Patent Publication No. 41708/73

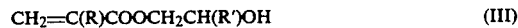

$$CH_2=C(R)COOCH_2CH(R')OH \qquad (III)$$

wherein R and R' each represents H or $CH_3$. Preferably urethane compound prepared by the reaction of 2 moles of hydroxyethyl acrylate and 1 mole of 2,4-tolylene diisocyanate.

The photo-polymerizable compositions of the present invention require water. If water is not present, the polymerization proceeds very slowly. The amount of water is sufficient in a catalytic amount and moisture in the air can be sufficiently utilized. When water in the photo-polymerizable compositions of the present invention escapes out of the system by evaporation, etc., the light sensitivity of the compositions deteriorates. Accordingly, it is preferred to add a compound which retains water in the composition. Examples of compounds added for such a purpose include aliphatic polyols and aliphatic polyethers. Particularly preferred examples of them include ethylene glycol, diethylene glycol, triethylene glycol, 1,3-propanediol, 1,2-propanediol, tetramethylene glycol, glycerine, trimethylolethane, trimethylolpropane, pentaerythritol, polyethylene glycol, polypropylene glycol, polyvinyl alcohol, and polyhydroxyethyl methacrylate.

The photo-polymerizable compositions of the present invention may contain, if desired, additives capable of dissolving or dispersing in the same solvent as that for the polyfunctional monomer and the high melecular binder.

Some kinds of spectrally sensitizing dyes effective for photographic gelatin-silver halide emulsions exhibit a sensitizing function for the photo-polymerizable compositions of the present invention. Examples of effective spectrally sensitizing dyes include cyanine dyes, merocyanine dyes, rhodacyanine dyes, complex (3 nuclei or 4 nuclei) cyanine or merocyanine dyes, holopolar cyanine dyes, styryl dyes, hemicyanine dyes, oxonol dyes, hemioxonol dyes and xanthene dyes.

Further, the photo-polymerizable compositions of the present invention may contain plasticizers. The plasticizers are effective for giving a desired flexibility to the photo-polymerizable layer and for increasing mobility of grown radicals at photo-polymerization so that the photo-polymerization reaction occurs smoothly. Examples of them include phthalic acid esters such as dimethyl phthalate, diethyl phthalate, di-n-butyl phthalate, di-n-hexyl phthalate, dicyclohexyl phthalate or ditridecyl phthalate, etc.; glycol esters such as dimethylglycol phthalate, ethylphthalylethyl glycolate or butylphthalylbutyl glycolate, etc.; phosphoric acid esters such as tricresyl phosphate or triphenyl phosphate, etc.; and aliphatic dibasic acid esters such as diisobutyl adipate, dioctyl adipate, dibutyl sebacate or dibutyl maleate, etc.

In order to prevent disadvantageous thermal polymerization of polyfunctional monomer during preparation of preservation of the compositions of the present invention, it is desirable to add a thermal polymerization inhibitor. Examples of suitable thermal polymerization inhibitors include hydroquinone p-methoxyphenol, di-t-butyl-p-cresol, pyrogallol, t-butylcatechol, benzoquinone, cuprous chloride, phenothiazine, chloranil, α-naphthylamine, β-naphthol, nitrobenzene and dintirobenzene, etc.

If desired, dyes or pigments may be added in order to color the photopolymerizable layer. Examples of such include Methylene Blue, Crystal Violet, Rhodamine B, Fuchsine, Auramine, azo dyes, anthraquinone dyes, titanium oxide, carbon black, iron oxide, phthalocyanine pigments and azo pigments, etc.

Generally, when carrying out photo-polymerization of the photo-polymerizable composition, the polymerization is interrupted under the influence of oxygen diffusing in the system. As a counterplan, it has been known to apply an oxygen impermeable protective layer as described in Japanese Patent Publication No. 32714/71 (U.S. Pat. No. 3,458,311). This art can be effectively utilized in case of the photo-polymerizable compositions of the present invention.

The photo-polymerizable compositions of the present invention are composed of the above-described components. Preferable ranges and particularly preferable ranges of each component are shown in the following as parts by weight based on 100 parts by weight of the photo-polymerizable composition.

|  | Preferable Range | Particularly Preferable Range |
| --- | --- | --- |
| Silver halide | 0.1–30 | 1–20 |
| High molecular binder | 10–90 | 20–60 |
| Polyfunctional monomer | 5–80 | 10–60 |
| Water | 0.01–5 | 0.1–1 |
| Water retentive compound | 1–50 | 5–30 |
| Spectral sensitizer | 0–0.5 | 0–0.1 |
| Plasticizer | 0–50 | 0–30 |
| Thermal polymerization inhibitor | 0–10 | 0–5 |
| Dye or pigment | 0–10 | 0–5 |

The photo-polymerizable compositions of the present invention are produced as follows.

The silver halide emulsion is prepared generally by a known rapid addition process, a single jet process or a double jet process in a presence of the high molecular binder of the present invention or a water soluble high polymer (such as gelatin). Preferably, after a high molecular binder is dissolved in an organic solvent, an aqueous solution of silver nitrate is dissolved or dispersed therein with stirring at a high rate by a homogenizer. To this solution or dispersion, a solution of ammonium halide, lithium halide, sodium halide or potassium halide, etc., in a solvent comprising an organic solvent as a major component is added. It is preferred that the silver halide used in the present invention has an average particle size of about 0.001μ to 1.0μ and preferably about 0.01 to 0.3μ.

The organic solvents used for production of the silver halide emulsion used in the present invention are those which contain carbon atoms and hydrogen atoms and have a boiling point of 165° C. or less and preferably less than 120° C. Preferably, the organic solvents include aromatic hydrocarbons, halogenated hydrocarbons, alcohols, ketones, amides, nitriles or ethers (including cyclic ethers), etc. Further, other solvents, namely, organic acids, organic sulfoxide and organic sulfonic acids, etc., can be used together with the above-described solvents. Typical examples of useful solvents include toluene, benzene, chloroform, ethylene chloride, acetone, methyl ethyl ketone, methyl isobutyl ketone, diethyl ketone, cyclohexanone, dimethylformamide, methyl alcohol, ethyl alcohol, n-propyl alcohol, isopropyl alcohol, n-butyl alcohol, iso-butyl alcohol, methoxyethanol, ethoxyethanol, n-butoxyethanol, benzyl alcohol, dioxane, tetrahydrofuran, dimethyl sulfoxide, sulforan, acetonitrile, dimethylacetamide, 1,2-dimethoxyethane, glacial acetic acid and triethylamine, etc. Particularly preferred organic solvents are those which are compatible with water in any ratio, such as, methanol, ethanol, iso-propanol, methoxyethanol and acetone.

The resulting emulsion of silver halide dispersed with the high molecular binder may be used by blending with other elements. However, the silver halide emulsion may be used according to the conventional method which comprises adding water or a non-solvent to the silver halide emulsion to cause coagulation, by which the greater parts of the polymer and the silver halide precipitate, washing with water or with a miscible non-solvent, and dispersing again in an organic solvent.

The resulting silver halide emulsion is blended with a polyfunctional monomer, a high molecular binder of the present invention and, if desired, a water retentive compound, a spectrally sensitizing dye, a plasticizer, a thermal polymerization inhibitor, a dye or a pigment, etc.

In order to make practical use of the resulting mixture, it is applied to a base, for example, a metal plate, resin film, thin paper or conventional paper, etc., and dried to form a sensitive layer. In this case, the sensitive layer can be utilized for printing plates, photography and photoresists, etc.

In order to form images, the sensitive layer is irradiated with active rays through an original or exposed to laser rays carrying information to cause photo-polymerization on the exposed part of the sensitive layer. Thereafter the unexposed non-polymerizing part is removed by processing with a suitable developing solution.

As the above-described light source, carbon arc lamps, mercury lamps, xenon lamps, tungsten lamps, Ar laser, He/Ne laser, carbon dioxide laser, Kr laser and YAG laser, etc., can be used.

As the developing solution for developing the sensitive layer of the photo-polymerizable composition of the present invention, it is possible to use known alkaline aqueous solution and alkaline aqueous solutions containing an organic solvent, and preferably solutions composed of water as major component as described in Japanese Patent Publication No. 33001/76 (U.S. Pat. No. 3,669,660) and Japanese Patent Applications (OPI) Nos. 88603/74, 77401/76 and 44202/78 (U.S. Pat. No. 4,186,006) (the term "OPI" as used herein refers to a "published unexamined Japanese patent application").

The photo-polymerizable compositions of the present invention not only have a very high light sensitivity but also can be spectrally sensitized by spectral sensitizing dyes used for silver halide photographic materials. Therefore, they have an excellent light sensitivity with respect to both visible rays and ultraviolet rays. Accordingly, they are remarkably suitable in the field requiring specially high sensitivity, for example, production of lithographic printing plates by scanning laser rays which carry image signals.

SYNTHESIS EXAMPLE 1

Production of copolymer composed of diacetoneacrylamide, n-butyl acrylate, acrylic acid and β-dimethylaminoethyl methacrylate (molar ratio 0.5:0.4:0.06:0.04)

(Copolymer I)

127 g of diacetoneacrylamide, 77 g of dibutyl acrylate, 6.5 g of acrylic acid, 9.5 g of β-dimethylaminoethyl methacrylate, 0.187 g of 2,2'-azobis(2,4-dimethylvaleronitrile) and 250 ml of isopropanol were put in a flask. The mixture was stirred at 60° C. for 19 hours while introducing nitrogen. The high molecular product was precipitated in water, washed with water and dried in vacuum at 70° C. (Yield: 157.5 g)

Analysis for $C_{390}H_{657}N_{27}O_{100}$ Calcd.(%): C 63.95 H 9.04 N 5.16 Found (%): C 63.19 H 9.18 N 5.00

The limiting viscosity ($[\eta]$) of this polymer was 0.14 in acetone at 25° C. This polymer did not dissolve in water but was soluble in not only isopropanol but also acetone, methanol, methyl cellosolve, ethyl acetate, chloroform and toluene.

SYNTHESIS EXAMPLES 2 TO 12

Copolymers II to XII shown in Table 1 were synthesized similarly to Synthesis Example 1. The elementary analysis of them agreed closely with calculation values. Further, the limiting viscosity ($[\eta]$) was about 0.1 to about 1.3 as shown in Table 1, which corresponded to a number average molecular weight of about 10,000 to about 100,000 according to GPC. These copolymers are soluble in isopropanol, toluene, acetone and chloroform but insoluble in water.

A summary of the copolymer obtained by Synthesis Examples 2 to 12 is put forth on the following Table 1.

TABLE 1

Synthesis of Copolymer

| Synthesis Example | Copolymer | Structural Formula* | Polymerization Solvent | $[\eta]$ |
|---|---|---|---|---|
| 2 | II | Copoly-(DAAM)$_{95}$(AA)$_5$ | Isopropanol | 0.22 |
| 3 | III | Copoly-(DAAM)$_{50}$(BA)$_{44}$(AA)$_6$ | " | 0.19 |
| 4 | IV | Copoly-(DAAM)$_{33}$(BA)$_{64}$(AA)$_3$ | " | 0.11 |
| 5 | V | Copoly-(DAAM)$_{70}$(BA)$_{20}$(DMAEMA)$_4$(AA)$_6$ | Benzene | 1.25 |
| 6 | VI | Copoly-(DAAM)$_{50}$(BA)$_{40}$(DMAPMA)$_4$(AA)$_6$ | Isopropanol | 0.18 |
| 7 | VII | Copoly-(DAAM)$_{60}$(BA)$_{30}$(DMAPMA)$_4$(AA)$_6$ | " | 0.18 |
| 8 | VIII | Copoly-(DAAM)$_{70}$(BA)$_{20}$(DMAPMA)$_4$(AA)$_6$ | " | 0.18 |
| 9 | IX | Copoly-(DAAM)$_{90}$(DMAEMA)$_4$(MAA)$_6$ | Methyl cellosolve | 0.42 |
| 10 | X | Copoly-(t-BuAAm)$_{90}$(DMAEMA)$_4$(MAA)$_6$ | " | 0.38 |
| 11 | XI | Copoly-(MAAm)$_{30}$(St)$_{50}$(DMAEMA)$_3$(AA)$_{17}$ | Isopropanol | 0.12 |
| 12 | XII | Copoly-(DAAM)$_{50}$(MBA)$_{40}$(DMAEMA)$_4$(MMA)$_6$ | " | 0.32 |

*Abbreviation of monomer unit:
DAAM: Diacetoneacrylamide
AA: Acrylic acid
BA: n-Butyl acrylate
DMAEMA: β-Dimethylaminoethyl methacrylate
DMAPMA: γ-Dimethylaminopropylmethacrylamide
MAA: Methacrylic acid
t-BuAAm: N—t-Butylacrylamide
MAAm: N—Methylacrylamide
St: Styrene
BMA: n-Butyl methacrylate

EXAMPLE 1

To 80 ml of a 5 wt% solution of Copolymer I obtained in Synthesis Example 1 in isopropanol, 2 ml of a 40 wt% aqueous solution of silver nitrate was added to dissolve therein and 40 ml of a 0.5 wt% solution of lithium chloride in methanol was added at a stretch with stirring at room temperature. Thus, a stabilized dispersion of very fine silver chloride particles (average particle size: 0.06μ) was obtained. To 10 ml of the dispersion, 70 mg of glycerine, 80 mg of triphenyl phosphate and 150 mg of pentaerythritol tetraacrylate were added and dissolved therein to obtain a coating solution. This coating solution was applied by a whirler at 250 rpm to an aluminum plate (the surface of which was grained mechanically or/and electrochemically, subjected to anodic oxidation and processed with silicate), followed by drying at 60° C. for 10 minutes. Thus, a uniform coating film of 1.8 g/m² which was not sticky was obtained. On the aluminum plate having the sensitive layer, a stepwedge gray scale (step difference: Δ log E=0.15, produced by Fuji Photo Film Co.) was laid and a Neutral Density Filter (optical density: 1.0) was laid thereon. Then, the sensitive layer was exposed to light by means of a jet printer (produced by ORC Co., light source: 2 kw ultra-high pressure mercury lamp) for 5 seconds in vacuum. The exposed photosensitive aluminum plate was processed with the Developing Solution A having the following composition for 1 minute. When washed with water for 10 seconds, an image which hardened up to the 4th step was obtained.

| Composition of Developing Solution A | |
|---|---|
| Benzyl alcohol | 30 g |
| Sodium t-butylnaphthalenesulfonate | 30 g |
| Sodium sulfite | 3 g |
| Monoethanolamine | 5 g |
| Triethanolamine | 20 g |
| Water | 2,000 ml |

A transparent film having a dot image was put on the same photosensitive aluminum plate. When exposure to light and development were carried out by the same procedure, a polymer image in which small dots were well reproduced was formed on the aluminum plate. When a developing ink PI2 for PS plate (trade name; produced by Fuji Photo Film Co.) was applied to the developed aluminum plate, the ink adhered to the image part but did not adhere to the non-image part. When printing was carried out by putting this plate to a GTO type offset printing machine, 20,000 copies having good quality were obtained.

EXAMPLES 2 TO 11

Examinations were carried out by the same manner as in Example 1 except that Copolymers II to XI prepared in Synthesis Examples 2 to 11 were used instead of Copolymer I in Example 1. Similar examinations were carried out using four kinds of polymer as comparative examples. Results are shown in Table 2.

In order to obtain a polymer image having high image quality and printing durability using a photopolymerizable composition containing dispersed silver halide, the following conditions are essential:

(1) photo-polymerization can effectively and highly proceed at the exposed area of the sensitive layer, and (2) the polymer image has sufficient ink acceptability.

In order to satisfy the condition (1) above, silver halide must be uniformly dispersed in a fine grain state in the sensitive layer. Further, in order to satisfy the condition (2) above, the polymer image must be sufficiently oleophilic.

As shown in Examples 2 to 11 in Table 2, it is apparent that the Copolymers II to XI of the present invention show good dispersion of silver chloride (shown in Table 2 as "average particle size") and form polymer images which undergo less swelling during development with aqueous developing solutions and have good ink-acceptability.

On the contrary, when the known water soluble polymers such as polyvinylpyrrolidone and polyacrylamide were used as a binder for dispersion (Comparative Examples 1 and 2), good dispersions of silver chloride were obtained. But, no polymer image was obtained (Comparative Example 1), or the resulting polymer image had bad ink-acceptability and swelled to a greater extent (Comparative Example 2).

When the known oleophilic binder was used (Comparative Examples 3 and 5), dispersion of silver chloride was difficult and thus no polymer image was obtained.

Further, when the silver chloride emulsion dispersed with gelatin (as a protective colloid) was dispersed in the known oleophilic binder (e.g., ethyl cellulose) and pentaerythritol tetraacrylate using lauryl sulfonate as a dispersing agent (Comparative Example 4), good dispersion of silver chloride was obtained but the resulting polymer image had very low strength because of poor adhesion to the base. In this case, if the lauryl sulfonate was not used, good dispersion of silver chloride could not be obtained.

Thus, it is unexpected for one skilled in the art that highly oleophilic polymer of the present invention can provide good dispersion of silver halide having a particle size of less than $1\mu$ in an organic solvent, that the photo-polymerizable composition containing such polymer as a binder can provide a polymer image having good image quality, and that the polymer image has good ink-acceptability together with sufficient high strength.

TABLE 2

Dispersibility of AgCl and Image Formation

| | Binder | Dispersion Medium | Average Particle Size ($\mu$) | Stickiness of Sensitive Layer | Developing Solution | Quality of Polymer Image | |
|---|---|---|---|---|---|---|---|
| | | | | | | Rubbing Strength (g) | Ink Acceptability |
| Example 2 | Copolymer II | Isopropanol | 0.85 | None | A | 50 | Good |
| Example 3 | Copolymer III | " | 0.24 | " | B* | 100 | " |
| Example 4 | Copolymer IV | " | 0.53 | " | A | 70 | " |
| Example 5 | Copolymer V | " | 0.41 | " | A | 80 | " |
| Example 6 | Copolymer VI | " | 0.22 | " | A | 120 | " |
| Example 7 | Copolymer VII | " | 0.36 | " | A | 60 | " |
| Example 8 | Copolymer VIII | " | 0.62 | " | A | 40 | " |
| Example 9 | Copolymer IX | Methyl cellosolve | 0.21 | " | A | 90 | " |
| Example 10 | Copolymer X | " | 0.10 | " | A | 120 | " |
| Example 11 | Copolymer XI | Isopropanol | 0.08 | " | A | 150 | " |
| Comparative Example 1 | Polyvinylpyrrolidone | Methanol | 3.2 | Sticky | Water (no image is obtained) | — | — |
| Comparative Example 2 | Polyacrylamide | Water | 2.0 | " | Water | 20 | Bad |
| Comparative Example 3 | Poly-diacetoneacrylamide | Isopropanol | Aggregation | — | (no image is obtained) | — | — |
| Comparative Example 4 | Ethyl cellulose (emulsion dispersed in gelatin) | Toluene | 4.0 | None | Toluene | 10 | Good |
| Comparative Example 5 | Copolymerized nylon CM8000 (produced by Toray Ind. Inc.) | Methanol | Aggregation — | — | (no image is obtained) | — | — |

Composition of Developing Solution B:
Trisodium phosphate    25 g
Monosodium phosphate    5 g

TABLE 2-continued

Dispersibility of AgCl and Image Formation

| | |
|---|---|
| Butyl cellosolve | 70 g |
| W-405 (10%) | 2 g |
| Water | 1,000 g |

EXAMPLE 12

A dispersion of silver bromide in a polymer was obtained by the same procedure as in Example 1 except for using lithium bromide instead of lithium chloride. The dispersion of silver bromide was excellent. Using this dispersion, an image was obtained similarly.

EXAMPLES 13 TO 19

0.2 ml of a solution containing $2 \times 10^{-3}$ mol/l of the spectral sensitizer shown in the following Table 3 in methanol was added to the coating solution of Example 1. The mixture was applied to the same aluminum plate and dried to obtain a sensitive plate containing the spectral sensitizer. A stepwedge gray scale was laid on the sensitive plate. After flash exposure was carried out 6 times by a Strobo (GN 32, produced by Matsushita Electric Co. PE 3650) at a distance of 6 cm while sucking the air in a vacuum frame, the sensitive plate was processed with the Developing Solution A for 1 minute. After washing with water for 10 seconds, the step number left on the aluminum plate was examined. The step numbers are shown in Table 3. It can be seen from Table 3 that sensitization of 2 to 10 steps was observed, as compared with the case of not containing the spectral sensitizer.

TABLE 3

| | Spectral Sensitization | | |
|---|---|---|---|
| Example No. | Spectral Sensitizer* | $\lambda_{max}^{MeOH}$ (nm) | Sensitivity (step number of stepwedge) |
| 13 | (A) | 580 | 14 |
| 14 | (B) | 487 | 14 |
| 15 | (C) | 490 | 9 |
| 16 | (D) | 465 | 7 |
| 17 | (E) | 459 | 6 |
| 18 | (F) | 490 | 11 |
| 19 | None | | 4 |

*Spectral Sensitizer (A):

[Chemical structure: chlorobenzoxazole connected via =CH—CH= to a thiohydantoin bearing (CH₂CH₂O)₂H and CH₃ substituents, with (CH₂)₃SO₃K chain]

*Spectral Sensitizer (B):

[Chemical structure: chlorobenzoxazole connected via =CH—CH= to a thiohydantoin bearing (CH₂CH₂O)₂H and pyridyl substituents, with (CH₂)₃SO₃K chain]

*Spectral Sensitizer (C):

[Chemical structure: bis-benzoxazole trimethine cyanine with $C_2H_5O$—C(=O)— and —$CO_2C_2H_5$ substituents, and (CH₂)₃SO₃⁻ / (CH₂)₃SO₃H chains]

Spectral Sensitizer (D):

[Chemical structure: bis-oxazole trimethine cyanine with phenyl substituents, and (CH₂)₃SO₃⁻ / (CH₂)₃SO₃Na chains]

Spectral Sensitizer (E):

[Chemical structure: bis-benzoxazole trimethine cyanine with gem-dimethyl groups ($H_5C_2$, $CH_3$ / $CH_3$, $C_2H_5$) and $C_2H_5$ / $C_2H_5$ N-substituents, I⁻ counterion]

Spectral Sensitizer (F):

[Chemical structure: bis(chlorobenzoxazole) trimethine cyanine with (CH₂)₃SO₃⁻ / (CH₂)₃SO₃⁻ chains, $HN^{\oplus}(C_2H_5)_3$ counterion]

EXAMPLE 20

Effect of sedimentation and redispersion of silver halide emulsion

A dispersion of silver chloride dispersed in Copolymer I obtained in Example 1 was put in a dialysis tube made of cellulose. When this dialysis tube was processed with tap water to carry out dialysis, aggregation of the silver halide emulsion occurred. Lumps of the high polymer containing the precipitated silver chloride particles were taken out and washed sufficiently with water, followed by stirring in 80 ml of isopropanol. Thus, a good dispersion of silver chloride was obtained again. To the resulting dispersion, pentaerythritol tetraacrylate, glycerine and triphenyl phosphate were added and dissolved therein. The dispersion was applied to an aluminum plate and dried. When imagelike exposure and development were carried out, a polymer image having excellent strength was obtained.

EXAMPLE 21

Desalting of emulsion

To 80 ml of a 5 wt% solution of Copolymer XII obtained in Synthesis Example 12 in isopropanol, 2 ml of a 40 wt% aqueous solution of silver nitrate was added with stirring at a room temperature to prepare a homogeneous solution. To the resulting solution, 40 ml of a 0.5 wt% solution of lithium chloride in methanol was added rapidly with stirring, by which a stabilized dispersion of finely divided silver chloride particles was obtained at once. When 150 ml of water was added to the resulting dispersion, the polymer aggregated in a state of containing silver chloride particles. After allowing it to stand for 10 minutes, the supernatant was removed by decantation, and the precipitate was washed sufficiently with water. When 120 ml of isopropanol was added to dissolve the polymer, a good dispersion of silver chloride was obtained again. A photo-polymerizable composition prepared by the same procedure as in Example 1 using the resulting dispersion produced a polymer image having good strength on the aluminum plate.

EXAMPLE 22

Use of a high polymer for dispersion of silver halide

To 50 ml of a 2 wt% solution of Copolymer I obtained in Synthesis Example 1 in isopropanol, 2 ml of a 40 wt% aqueous solution of silver nitrate was added and dissolved therein. To the resulting solution, 40 ml of a 0.5 wt% solution of lithium chloride in methanol was added rapidly with stirring at room temperature. When 30 ml of a 7 wt% solution of copolymerized nylon CM 8000 (produced by Toray Industries, Inc.) was added to the resulting dispersion of silver chloride, a good dispersion state of silver chloride was maintained.

To the resulting dispersion, suitable components were added similarly to Example 1 to prepare a coating solution. It was applied to an aluminum plate and dried to form a sensitive plate. On the resulting sensitive plate, a stepwedge gray scale and two Neutral Density Filters having an optical density of 1.0 were laid in this order. When it was exposed to light for 5 seconds by a jet printer, it had a sensitivity of the 5th step.

EXAMPLE 23

Use of a high polymer for dispersion of silver halide

To 50 ml of a 2 wt% solution of polyvinylpyrrolidone (K-15) in isopropanol, 2 ml of a 40 wt% aqueous solution of silver nitrate was added and dissolved therein. To the resulting solution, 40 ml of a 0.5 wt% solution of lithium chloride in methanol was added at a stretch with stirring at room temperature. When 30 ml of a 9 wt% solution of Copolymer XII in methanol was added to the resulting silver chloride dispersion, a good dispersion state of silver chloride was maintained.

To the resulting dispersion, suitable components were added similarly to Example 1 to prepare a coating solution. It was applied to an aluminum plate and dried to form a sensitive plate. On the resulting sensitive plate, a stepwedge gray scale and a Neutral Density Filter having an optical density of 1.0 were laid in this order. When it was exposed to light for 5 seconds by a jet printer, it had a sensitivity of the 4th step.

EXAMPLE 24

To 80 ml of a 5 wt% solution of Copolymer XII obtained in Synthesis Example 12 in isopropanol, 4 ml of a 40 wt% aqueous solution of silver nitrate was added with stirring at room temperature to prepare a homogeneous solution. To the resulting solution, 40 ml of a 1.0 wt% solution of lithium chloride in methanol was rapidly added with stirring. Thus, a stabilized dispersion of very fine silver chloride particles was obtained. To 10 ml of the dispersion, 80 mg of glycerine and 720 mg of pentaerythritol tetraacrylate were added and dissolved therein to obtain a coating solution. The resulting coating solution was applied to an aluminum plate (the surface of which was grained electrolytically, subjected to anodic oxidation and processed with silicate) by a whirler at 250 rpm, and dried at 100° C. for 3 minutes. Thus, a uniform coating film of 2.0 g/m² was obtained. On the resulting photosensitive aluminum plate, a stepwedge gray scale was laid, and the photosensitive aluminum plate was exposed to light by a jet printer under a reduced pressure for 4 seconds. After the exposed photosensitive aluminum plate was immersed in a developing solution consisting of isopropanol and water (10:1) for 1 minute, it was rubbed with an absorbent cotton soaked with the developing solution, by which an image hardened up to the 10th step was obtained. On the resulting photosensitive aluminum plate, a transparent film having a dot image was laid, and the photosensitive aluminum plate was exposed to light and developed similarly. When printing was carried out by a printing machine, 10,000 sheets of good printed matter were obtained.

In summary, according to the photo-polymerizable composition of the present invention, the silver halide can be finely, uniformly and stably dispersed by the oleophilic polymer binder of the present invention. Thus, photo-polymerization can effectively proceed at the exposed area and provide a polymer image with high quality and high strength. Further, the resulting polymer image has good printing durability, i.e., high strength and good ink-acceptability. Furthermore, the photo-polymerizable composition of the present invention can be developed with a water type developing solution and the resulting polymer image has good printing durability.

It cannot be expected for one skilled in the art that these improvements can be achieved by using the polymer of the present invention as a binder for dispersing silver halide.

While the invention has been described in detail and with reference to specific embodiments thereof, it will be apparent to one skilled in the art that various changes and modifications can be made therein without departing from the spirit and scope thereof.

What is claimed is:

1. A photo-polymerization process for forming an image wherein photosensitive silver halide is used as a photoinitiator in a photo-polymerization composition comprising (1) 0.1 to 30 parts by weight of silver halide;
(2) 5 to 80 parts by weight of a polymerizable compound having at least two carbon-carbon unsaturated bonds in a molecule thereof; and
(3) 10 to 90 parts by weight of a high molecular binder, said silver halide made by the reaction of silver nitrate with an alkali metal or ammonium halide in a solution comprising said high molecular binder and an organic solvent, said process comprising image-wise exposing said photopolymerizable composition and then removing unexposed unpolymerized areas, wherein the improvement comprises (A) using as said high molecular binder a copolymer represented by the following formula (I):

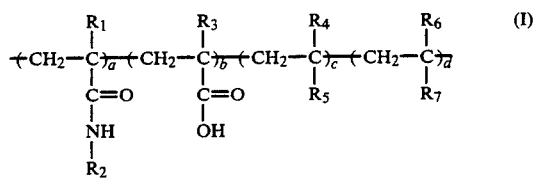

wherein $R_1$, $R_4$, $R_6$ and $R_{10}$ represents H or $CH_3$;

$R_2$ represents H, $C_{1-8}$ alkyl or

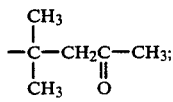

$R_3$ represents H, $CH_3$ or $CH_2COOH$;

$R_5$ represents $COOR_8$,

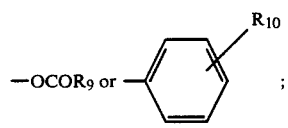

$R_7$ represents 

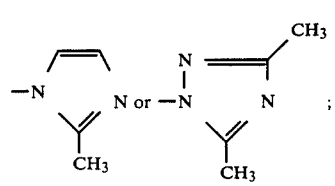

$R_8$ represents $C_{1-8}$ alkyl or 

$R_9$ represents $C_{1-3}$ alkyl;

$R_{11}$ represents $+CH_2+_2$, $+CH_2+_3$ or ─⟨⟩;

$R_{12}$ represents $C_{1-8}$ alkyl;
X represents —O— or —NH—;
a represents 99–10% by mol;
b represents 1–20% by mol;
c represents 0–80% by mol; and
d represents 0–10% by mol, the copolymer having a molecular weight of about 5,000 to 1,000,000, and the copolymer being soluble in organic solvent and insoluble in water and (B) developing said image-wise exposed composition to remove unexposed unpolymerized areas by an alkaline aqueous solution or an alkaline aqueous solution containing an organic solvent.

2. A photo-polymerization process of claim 1 wherein said dispersion composition, further comprises:
a water retentive compound;
a spectral sensitizer;
a plasticizer;
a thermal polymerization inhibitor; and
a dye or pigment.

3. A photo-polymerization process as claimed in claim 2, wherein water is present in the photo-polymerizable composition in an amount of 0.1 to 5 parts by weight, the water retentive compound is present in an amount of 1 to 50 parts by weight, the spectral sensitizer is present in an amount of 0.5 part by weight or less, the plasticizer is present in an amount of 50 parts by weight or less, the thermal polymerization inhibitor is present in an amount of 10 parts by weight or less, and the dye or pigment is present in an amount of 10 parts by weight or less, wherein the parts by weight are based on 100 parts by weight of the photo-polymerizable composition.

4. A photo-polymerization process as claimed in claim 3, wherein in the photo-polymerizable composition the silver halide is present in an amount of 1 to 20 parts by weight, the binder is present in an amount of 20 to 60 parts by weight, the polymerizable compound is present in an amount of 10 to 60 parts by weight, the water is present in an amount of 0.1 to 1 part by weight, the water retentive compound is present in an amount of 5 to 30 parts by weight, the spectral sensitizer is present in an amount of 0.1 part by weight or less, the plasticizer is present in an amount of 30 parts by weight or less, the thermal polymerization inhibitor in an amount of 5 parts by weight or less, and the dye or pigment is present in an amount of 5 parts by weight or less.

5. A photo-polymerization process as claimed in claim 1, wherein the silver halide has an average particle size of about $0.001\mu$ to $1.0\mu$.

* * * * *